(12) United States Patent
Curtis et al.

(10) Patent No.: US 11,088,666 B2
(45) Date of Patent: Aug. 10, 2021

(54) OPERATIONAL AMPLIFIER WITH CONTROLLABLE OUTPUT MODES

(71) Applicant: Microchip Technology Incorporated, Chandler, AZ (US)

(72) Inventors: Keith Edwin Curtis, Queen Creek, AZ (US); Ward Brown, Chandler, AZ (US); John Charais, Oxonomowoc, WI (US); Steve Kennelly, Mesa, AZ (US); Dave Suda, Fort Collins, CO (US); Huamin Zhou, Chandler, AZ (US); Clark Rogers, Phoenix, AZ (US); Mudit Gupta, Tempe, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 106 days.

(21) Appl. No.: 16/411,449

(22) Filed: May 14, 2019

(65) Prior Publication Data

US 2020/0119706 A1 Apr. 16, 2020

Related U.S. Application Data

(60) Provisional application No. 62/744,276, filed on Oct. 11, 2018.

(51) Int. Cl.
*H03F 3/45* (2006.01)
(52) U.S. Cl.
CPC ..... *H03F 3/45511* (2013.01); *H03F 3/45713* (2013.01)

(58) Field of Classification Search
CPC ............. H03F 3/45511; H03F 3/45713; H03F 3/45085; H03F 1/3211; H03F 3/45071;
(Continued)

(56) References Cited

U.S. PATENT DOCUMENTS

| 5,331,210 A | 7/1994 | Mccarroll | 327/58 |
| 6,177,814 B1 | 1/2001 | Taguchi | 327/58 |

(Continued)

FOREIGN PATENT DOCUMENTS

JP 2009225026 * 10/2009 ......... H03F 3/45183

OTHER PUBLICATIONS

International Search Report and Written Opinion, Application No. PCT/US2019/037864, 12 pages, dated Aug. 2, 2019.

*Primary Examiner* — Khanh V Nguyen
(74) *Attorney, Agent, or Firm* — Slayden Grubert Beard PLLC (57) ABSTRACT

An operational amplifier with totem pole connected output transistors having inputs coupled to multiplexers for selectable coupling of signals and voltage levels thereto. The high and low output transistors may be forced hard on or hard off in addition to normal coupling of signals thereto. The operation of the output transistors may be dynamically changed to pass only positive going signals, negative going signals, placed in a tristate high impedance state, hard connected to a supply voltage and/or hard connected to supply common return. A core independent peripheral (CIP) may also be coupled to the operational amplifier for dynamically changing the multiplexer inputs in real time, as can external control signals to a control circuit coupled to the multiplexers.

23 Claims, 8 Drawing Sheets

(58) Field of Classification Search
CPC ............. H03F 3/45183; H03F 3/45179; H03F 3/45192
USPC .................................................. 330/252, 253
See application file for complete search history.

(56) References Cited

U.S. PATENT DOCUMENTS

| | | | |
|---|---|---|---|
| 8,537,153 B2* | 9/2013 | Wu ........................... | H03F 3/72 345/214 |
| 9,757,565 B2* | 9/2017 | Marnfeldt ................ | A61N 1/37 |
| 2016/0118970 A1 | 4/2016 | Kim et al. .................... | 330/254 |
| 2020/0162025 A1* | 5/2020 | Tsai ....................... | H03F 1/0211 |

* cited by examiner

OPERATIONAL AMPLIFIER WITH CONTROLLABLE OUTPUT MODES

RELATED PATENT APPLICATION

This application claims priority to commonly owned U.S. Provisional Patent Application Ser. No. 62/744,276; filed Oct. 11, 2018; entitled "Operational Amplifier with Peak Track and Hold Output Modes," and is hereby incorporated by reference herein for all purposes.

TECHNICAL FIELD

The present disclosure relates to operational amplifiers and, more particularly, to an operational amplifier with controllable output modes.

BACKGROUND

Figure 1:
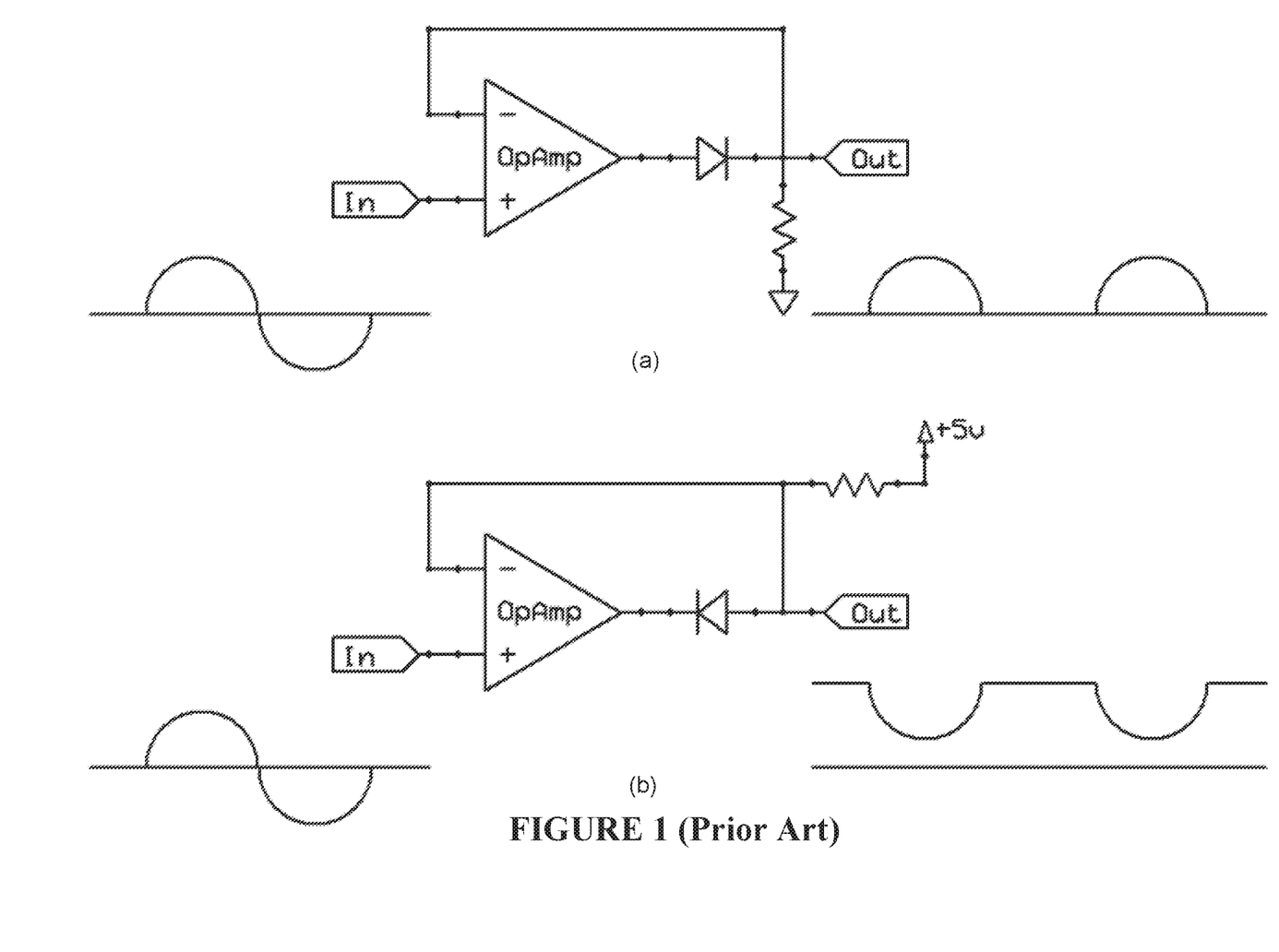
FIG. 1 illustrates prior art schematic and waveform diagrams of maximum and minimum DC amplitude tracking circuits comprising operational amplifiers and diode/transistors in the output path.

AC coupled waveforms often require DC level restoration for processing. To accomplish this detection of minimum and maximum voltages of a signal waveform are needed to generate an offset. A circuit may be used to track a minimum or maximum voltage amplitude value of the signal waveform in real time and provides this voltage level to a DC level restoration circuit. Typically, this tracking is accomplished with an operational amplifier and an external diode/transistor as shown in FIGS. 1a and 1b.

Figure 2:
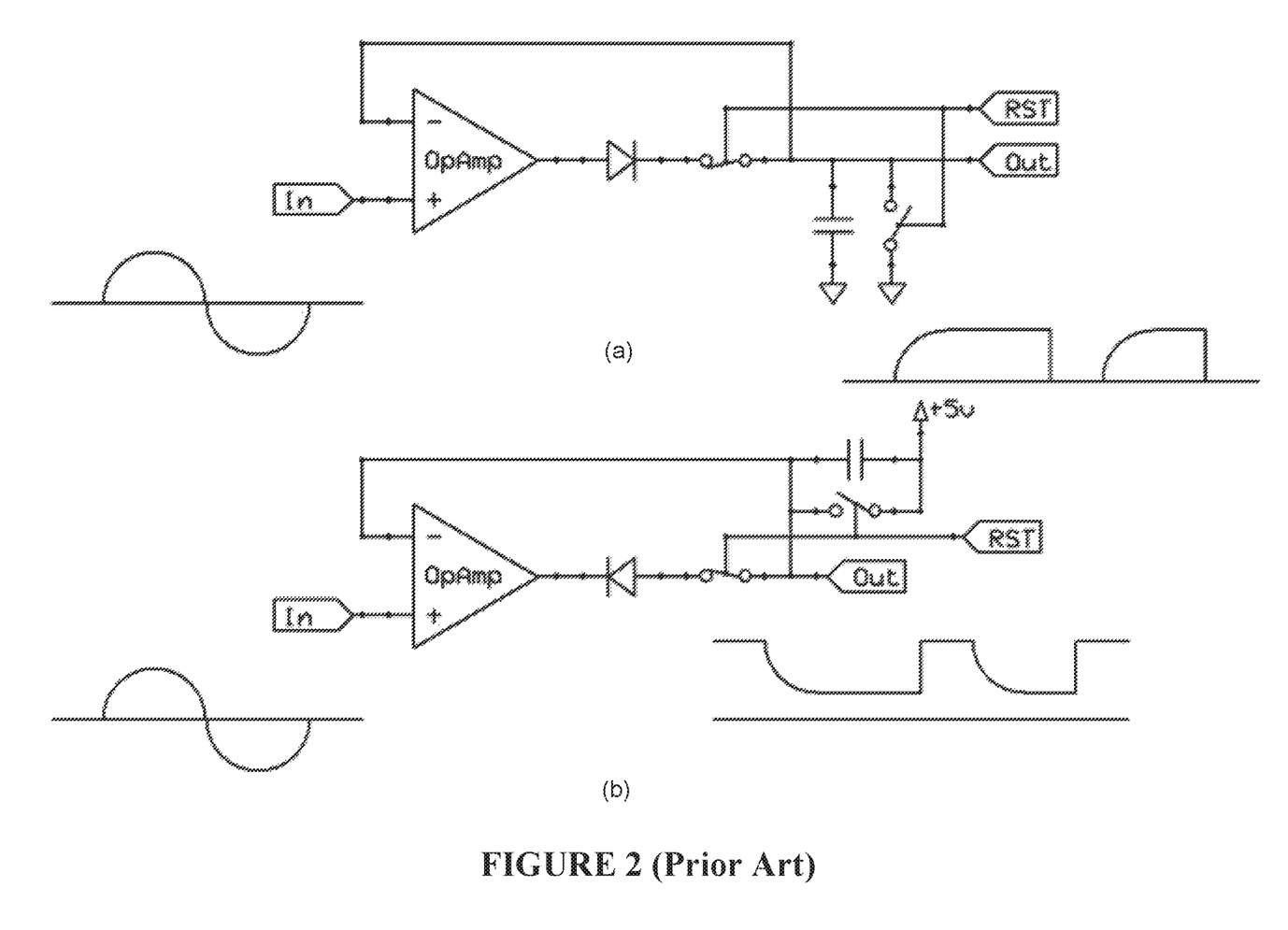
FIG. 2 illustrates prior art schematic diagrams of maximum and minimum DC amplitude detection circuits with reset comprising operational amplifiers, diode/transistors and switches in the output path.

Known designs use an external diode/transistor to convert the totem pole output of an operational amplifier into a high side/low side only driver. This has two problems, the forward bias voltage of the diode/transistor reduces common mode range, and the inability to dynamically, control the output configuration limits the design to the circuit layout option selected. Furthermore, external switches are required to reset the operational amplifier output and/or do output signal blanking as shown in FIGS. 2a and 2b.

SUMMARY

Therefore, what is needed is a way to track maximum and/or minimum waveform amplitudes in real time with increased common mode range and without requiring external diodes and/or switches coupled to the peak detection operational amplifier.

According to an embodiment, an operational amplifier having controllable output modes may comprise: a differential input transistor pair; a first multiplexer having a first input coupled to a supply voltage, a second input coupled to the differential input transistor pair, a third input coupled to a supply common return and an output coupled to an input of a first output transistor; a second multiplexer having a first input coupled to the supply voltage, a second input coupled to the differential input transistor pair, a third input coupled to the supply common return and an output coupled to an input of a second output transistor; and a control circuit coupled to the first and second multiplexers for selecting the inputs thereof.

According to a further embodiment, the first and second output transistors may be totem pole configured with an output therebetween, wherein the first output transistor may be coupled to the supply voltage and the second output transistor may be coupled to the supply common return. According to a further embodiment, the first output transistor may be hard on when the first input of the first multiplexer may be selected. According to a further embodiment, the first output transistor may be controlled by the differential input transistor pair when the second input of the first multiplexer may be selected. According to a further embodiment, the first output transistor may be off when the third input of the first multiplexer may be selected. According to a further embodiment, the second output transistor may be off when the first input of the second multiplexer may be selected. According to a further embodiment, the second output transistor may be controlled by the differential input transistor pair when the second input of the second multiplexer may be selected. According to a further embodiment; the second output transistor may be hard on when the third input of the second multiplexer may be selected.

According to a further embodiment, an external connection to the control circuit may be used for externally controlling the selection of the inputs of the first and second multiplexers. According to a further embodiment, a core independent peripheral (CIP) may be coupled to the control circuit. According to a further embodiment, the CIP may have inputs coupled to inputs of the differential input transistor pair for measuring voltages thereon. According to a further embodiment, the CIP may have an input coupled to an output of the first and second output transistors for measuring an output voltage therefrom.

According to another embodiment, a circuit for at least partially tracking an input signal may comprise: a differential input transistor pair having inputs coupled to a signal; a first multiplexer having a first input coupled to a supply voltage, a second input coupled to the differential input transistor pair, a third input coupled to a supply common return and an output coupled to an input of a first output transistor; a second multiplexer having a first input coupled to the supply voltage, a second input coupled to the differential input transistor pair, a third input coupled to the supply common return and an output coupled to an input of a second output transistor; the first and second output transistors may be totem pole configured with an output therebetween, wherein the first output transistor may be coupled to the supply voltage and the second output transistor may be coupled to the supply common return; and a control circuit coupled to the first and second multiplexers for selecting the inputs thereof; wherein selection of a certain combination of the first and second multiplexer inputs determines what part of the signal may be tracked.

According to a further embodiment, a positive input voltage amplitude tracking circuit may be configured when the second input of the first multiplexer and the first input of the second multiplexer may be selected. According to a further embodiment, a negative input voltage amplitude tracking circuit may be configured when the third input of the first multiplexer and the second input of the second multiplexer may be selected.

According to a further embodiment, a positive input voltage tracking and hold circuit may comprise: a capacitor coupled between the output of the first and second output transistors and the supply common return; the second input of the first multiplexer may be selected; and the first input of the second multiplexer may be selected; whereby the capacitor may be charged when a voltage input to the differential input transistor pair may be positive. According to a further embodiment, the capacitor may be discharged when the third input of the first multiplexer and the third input of the second multiplexer may be selected.

According to a further embodiment, a negative voltage tracking and hold circuit may comprise: a capacitor coupled between the output of the first and second output transistors and the supply voltage; the third input of the first multiplexer may be selected; and the second input of the second multiplexer may be selected; whereby the capacitor may be charged when a voltage input to the differential input transistor pair may be negative. According to a further embodiment, the capacitor may be discharged when the first input of the first multiplexer and the first input of the second multiplexer may be selected.

According to a further embodiment, a maximum and minimum DC amplitude tracking and hold circuit may comprise: a capacitor may be coupled between the output of the first and second output transistors and the supply common return, the capacitor may be charged when the second input of the first multiplexer and the first input of the second multiplexer may be selected and a voltage input to the differential input transistor pair may be positive, and the capacitor may be discharged when the third input of the first multiplexer and the second input of the second multiplexer may be selected and the voltage input to the differential input transistor pair may be negative. According to a further embodiment, a control circuit may be coupled to the first and second multiplexers and control the selection of the first and second multiplexer inputs.

According to yet another embodiment, a method for configuring operation of an operational amplifier output may comprise the steps of: providing a first multiplexer having a first input coupled to a supply voltage, a second input coupled to a differential input transistor pair, a third input coupled to a supply common return and an output coupled to an input of a first output transistor; providing a second multiplexer having a first input coupled to the supply voltage, a second input coupled to the differential input transistor pair, a third input coupled to the supply common return and an output coupled to an input of a second output transistor; and selecting inputs of the first and second multiplexers to configure operation of the first and second output transistors. According to a further embodiment of the method, the step of selecting the inputs of the first and second multiplexers may be done with a core independent peripheral (CIP).

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Embodiments of the present disclosure may comprise a device having an operational amplifier and multiplexers to control output configurations thereof. According to the teachings of this disclosure, this embodiment does not require an external device for maximum or minimum peak waveform detection and has the added advantage that the output thereof may be tristate (switched to high impedance) to implement output blanking in the event of fast transient noise occurrences.

The operational amplifier may have multiple output modes; e.g., inter-alia, disable high side driver (off), disable low side driver (off), high side output transistor continuously on to rail voltage, low side output transistor continuously on to common, or tristate. If the low side transistor is driven off, the operational amplifier may become a peak (maximum) track and hold amplifier. If the high side transistor is driven off, the operational amplifier may become a minimum amplitude track and hold amplifier. Because the operational amplifier configuration controls may be implemented as a core independent peripheral (CIP), external logic may dynamically control both high and low drivers for peak/minimum hold with noise blanking.

A core independent peripheral (CIP) handles tasks with no code or supervision required by a central processing unit (CPU), e.g., microcontroller core unit (MCU), to maintain operation thereof. Once initialized in a system, CIPs can provide steady-state closed loop embedded control with zero intervention from the MCU's core. The CPU can then be idled or put into SLEEP mode to save system power while the CIP may still maintain operation. CIPs may be, for example but are not limited to, a configurable operational amplifier, a numerically controlled oscillator (NCO), a configurable logic cell (CLC), an analog-to-digital converter (ADC) with state machines that don't need the CPU to transfer converted data, a pulse width modulator (PWM), a cyclic redundancy check (CRC), a math accelerator, a programmable switch mode controller, a watch dog timer, an angular timer, a complementary waveform generator (CWG), or timers, and the like. Microchip Technology Incorporated, the assignee of this application, provides more information on their CIPs at https://www.microchip.com/design-centers/8-bit/peripherals/core-independent.

The preferred embodiments disclosed herein simplify the implementation of a peak/min track and hold for automatic gain control (AGC) systems, DC level restoration, and peak hold systems that may comprise, but is not limited to, an integrated circuit function with only an external capacitor and/or resistor required.

Preferred embodiments of the present disclosure may comprise an operational amplifier CIP peripheral with the ability to disable the high side output driver and/or the low side driver using either software, and/or two internal CIP connections to timers/configurable logic cells (CLCs).

Only one component, e.g., resistor or capacitor, need be coupled with the operational amplifier and the ability to dynamically change the output mode selection of the operational amplifier based upon internal digital controls. This also eliminates the need for an output switch to implement a noise blanking function.

Referring now to the drawings, the details of example embodiments are schematically illustrated. Like elements in the drawings will be represented by like numbers, and similar elements will be represented by like numbers with a different lower-case letter suffix.

Referring to FIGS. 1(a) and 1(b), depicted are prior art schematic and waveform diagrams of maximum and minimum DC amplitude tracking circuits comprising operational amplifiers and diode/transistors in the output path. The operational amplifier with an output diode shown in FIG. 1(a) is a maximum amplitude waveform tracker and will provide positive going input voltages at its output referenced to a common voltage potential. The operational amplifier with an output diode shown in FIG. 1(b) is a minimum amplitude waveform tracker and will provide negative going input voltages at its output referenced to a +V (e.g., 5 vdc) voltage potential.

Referring to FIGS. 2(a) and 2(b), depicted are prior art schematic diagrams of maximum and minimum DC detection circuits with reset comprising operational amplifiers, diode/transistors and switches in the output path. The external switches are necessary to perform the reset function. The operational amplifier with an output diode, capacitor and reset switches shown in FIG. 2(a) is a maximum (peak) amplitude waveform detector and will provide positive going input voltages at its output referenced to a common voltage potential. The capacitor charges up to the maximum (peak) amplitude of the input waveform and will hold this maximum amplitude voltage until discharged by a switch shorting it to the common voltage potential. The operational amplifier with an output diode, capacitor and reset switches shown in FIG. 2(b) is a minimum amplitude waveform detector and will provide negative going input voltages at its output referenced to a +V (e.g., 5 vdc) voltage potential. The capacitor charges up to the minimum amplitude of the input waveform and will hold this minimum amplitude voltage until discharged by a switch shorting it to the +V voltage potential.

Figure 3:
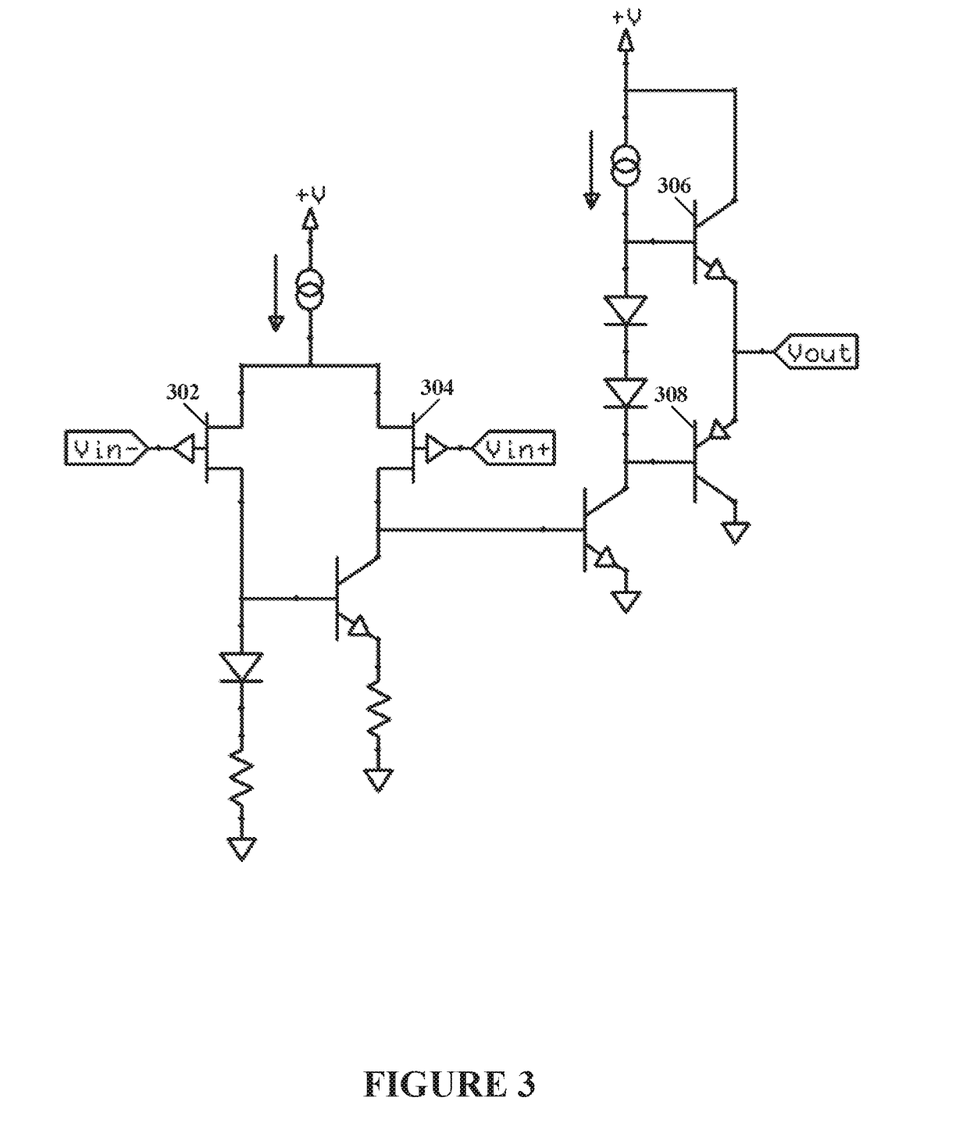
FIG. 3 illustrates a schematic diagram of a typical operational amplifier.

Referring to FIG. 3, depicted is a schematic diagram of a typical operational amplifier. The operational amplifier shown in FIG. 3 may comprise differentially connected input transistors 302 and 304, and totem pole connected single ended output transistors 306 and 308. This operational amplifier may amplify the difference between the input voltages Vin+ and Vin− and output that voltage difference as Vout (with or without amplification).

Figure 4:
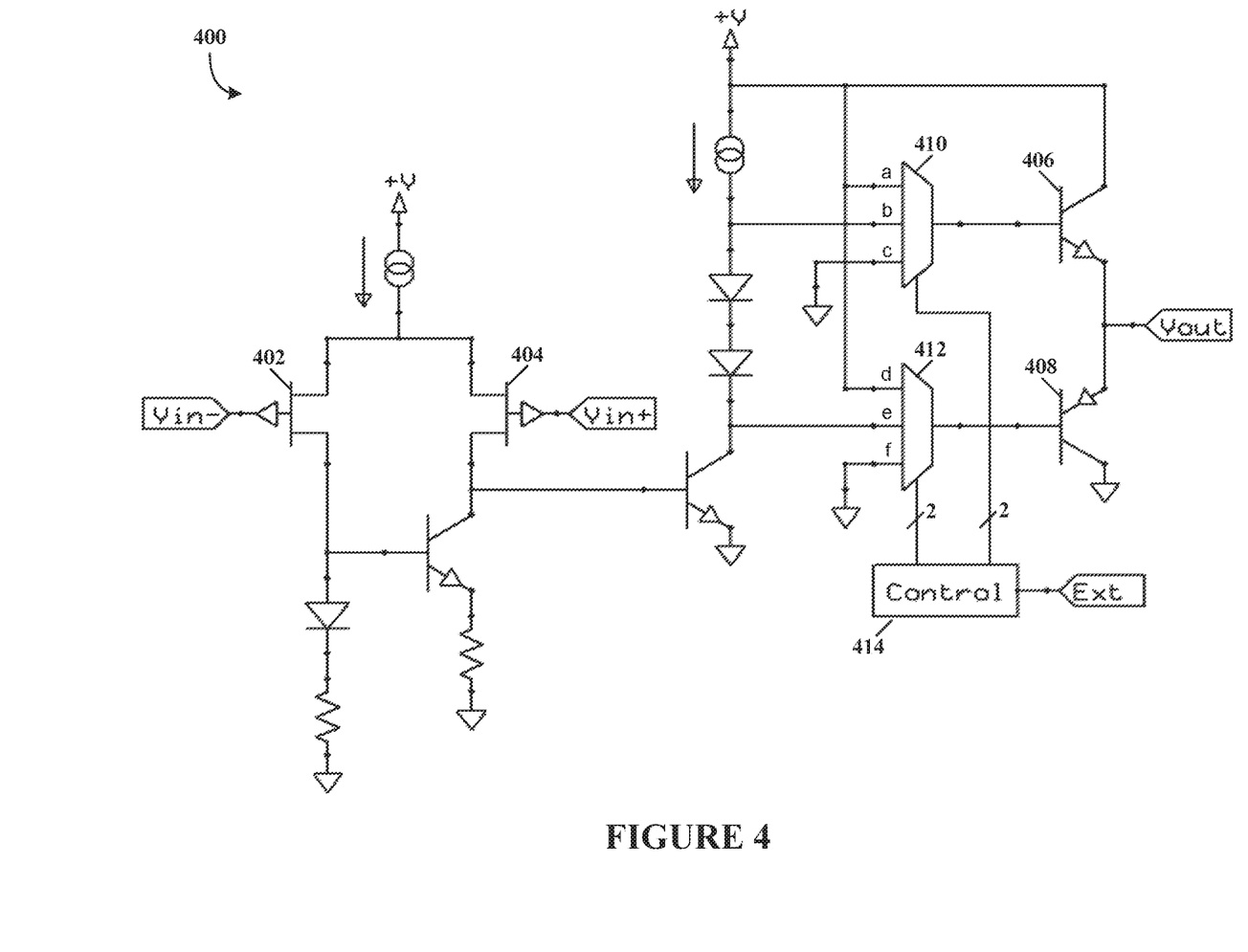
FIG. 4 illustrates a schematic diagram of an operational amplifier having controllable output modes, according to specific example embodiments of this disclosure.

Referring to FIG. 4, depicted is a schematic diagram of an operational amplifier having controllable output modes, according to specific example embodiments of this disclosure. An operational amplifier with controllable output modes, generally represented by the numeral 400, may be adaptable for maximum and minimum peak voltage detection, track and hold output modes. The operational amplifier 400 may comprise differential input transistors 402 and 404, multiplexers 410 and 412, a control circuit 414, totem pole coupled output transistors 406 and 408, and other operational amplifier circuit components. The multiplexer 410 may be used to select what signal or voltage is provided to the base/gate of the transistor 406, and the multiplexer 412 may be used to select what signal or voltage is provided to the base/gate of the transistor 408. Control lines (two signals each) are used to couple the control circuit 414 to the multiplexers 410 and 412 for input selection thereof. By applying external control commands to the Ext input, e.g., I²C, SPI, etc., the output of the operational amplifier 400 may be configured as required. Example output configurations are described in Table I hereinbelow. Transistors 406 and 408 are shown in FIG. 4 as bipolar junction transistors, however, metal oxide field effect transistors MOSFETs may be used equally effectively, wherein a drain is substantially equivalent to a collector, a gate is substantially equivalent to a base, and a source is substantially equivalent to an emitter.

When input a of multiplexer 410 is selected then transistor 406 is turned on hard and Vout is force to +V. When input b of multiplexer 410 is selected then the output of transistor 406 will be controlled by the differential input Vin, and Vout will follow Vin, as in the operational amplifier of FIG. 3, unless transistor 408 is turned on hard (input f of multiplexer 412 is selected). When input c of multiplexer 410 is selected then transistor 406 will remain off.

When input d of multiplexer 412 is selected then transistor 408 will remain off. When input e of multiplexer 412 is selected then the output of transistor 408 will be controlled by the differential input Vin, and Vout will follow Vin, as in the operational amplifier of FIG. 3, unless transistor 406 is turned on hard (input a of multiplexer 410 is selected). When input f of multiplexer 412 is selected then transistor 408 is turned on hard and \Tout is force to a common voltage potential.

To set the output of operational amplifier 400 to a high impedance state (tristate), the following configuration may be used. When input c of multiplexer 410 is selected transistor 406 will be off, and when input d of multiplexer 412 is selected transistor 408 will be off, thereby putting the junction between transistors 406 and 408 (Vout) into a high impedance state. The various combinations of inputs a-f may be used to perform a high or a low reset, output signal blanking, tristate, open collector/drain, open emitter/source and totem pole output of the operational amplifier 400 as described in Table I below.

Referring to Table I below, depicted is a table summary of output configurations based upon multiplexer input selections for the operational amplifier circuit shown in FIG. 4, according to specific example embodiments of this disclosure. Using the appropriate control signals from the control circuit 414, combinational input selections of multiplexer 410 inputs a, b or c; and multiplexer 412 inputs d, e or f may be selected (responsive to internal or external commands) resulting in the operation of the operational amplifier 400 having an output configured as, but is not limited to, what is listed in Table I below.

TABLE I

| Output Configurations | Multiplexer Input Selections |
|---|---|
| Hi-Z Tristate (output transistors off) | Mux 410 (c), Mux 412 (d) |
| Totem pole output | Mux 410 (b), Mux 412 (e) |
| Open Collect/Drain | Mux 410 (c), Mux 412 (e) |
| Open Emitter/Source | Mux 410 (b), Mux 412 (d) |
| Force output to supply common return | Mux 410 (c), Mux 412 (f) |
| Force output to supply voltage | Mux 410 (a), Mux 412 (d) |

Figure 5:
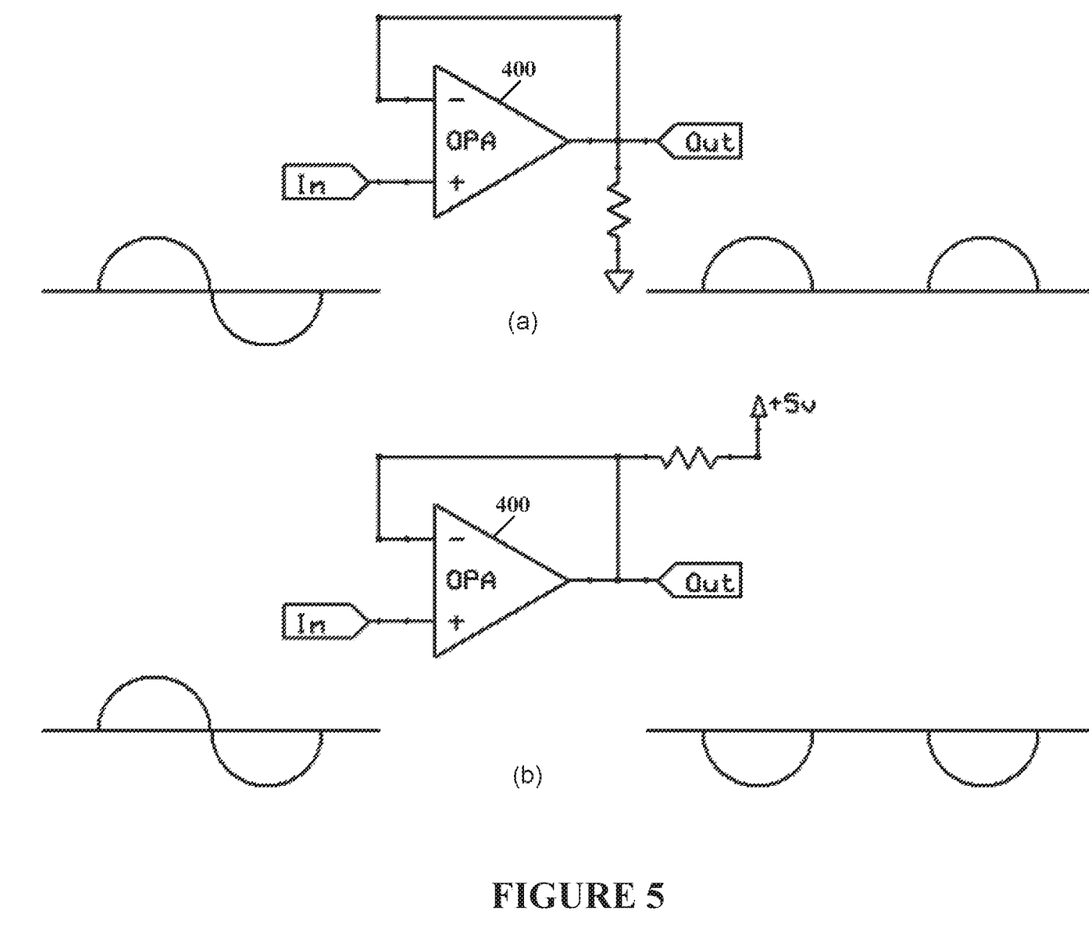
FIG. 5 illustrates schematic and waveform diagrams of maximum and minimum DC amplitude tracking circuits, according to specific example embodiments of this disclosure.

Referring to FIGS. 5(a) and 5(b), depicted are schematic and waveform diagrams of maximum and minimum DC, amplitude tracking circuits, according to specific example embodiments of this disclosure. The circuits shown in FIGS. 5(a) and 5(b) utilize the operational amplifier 400 having controllable output modes, as more fully described hereinabove. The circuit of FIG. 5(a) may be used as a maximum amplitude waveform tracker by selecting (see FIG. 4) the b input of multiplexer 410 and the d input of multiplexer 412. This configuration effectively, allows the output of transistor 406 (Vout) to follow the positive excursions of the input Vin with the output Vout being pulled to common (ground) otherwise through the resistor coupled between the output and common, since transistor 408 is kept off responsive to the selected d input.

The circuit of FIG. 5(b) may be used as a minimum amplitude tracker by selecting (see FIG. 4) the c input of multiplexer 410 and the e input of multiplexer 412. This configuration effectively allows the output of transistor 408 (Vout) to follow the negative excursions of the input Vin with the output Vout being pulled to +V otherwise through the resistor coupled between the output and +V, since transistor 406 is kept off responsive to the selected c input.

Figure 6:
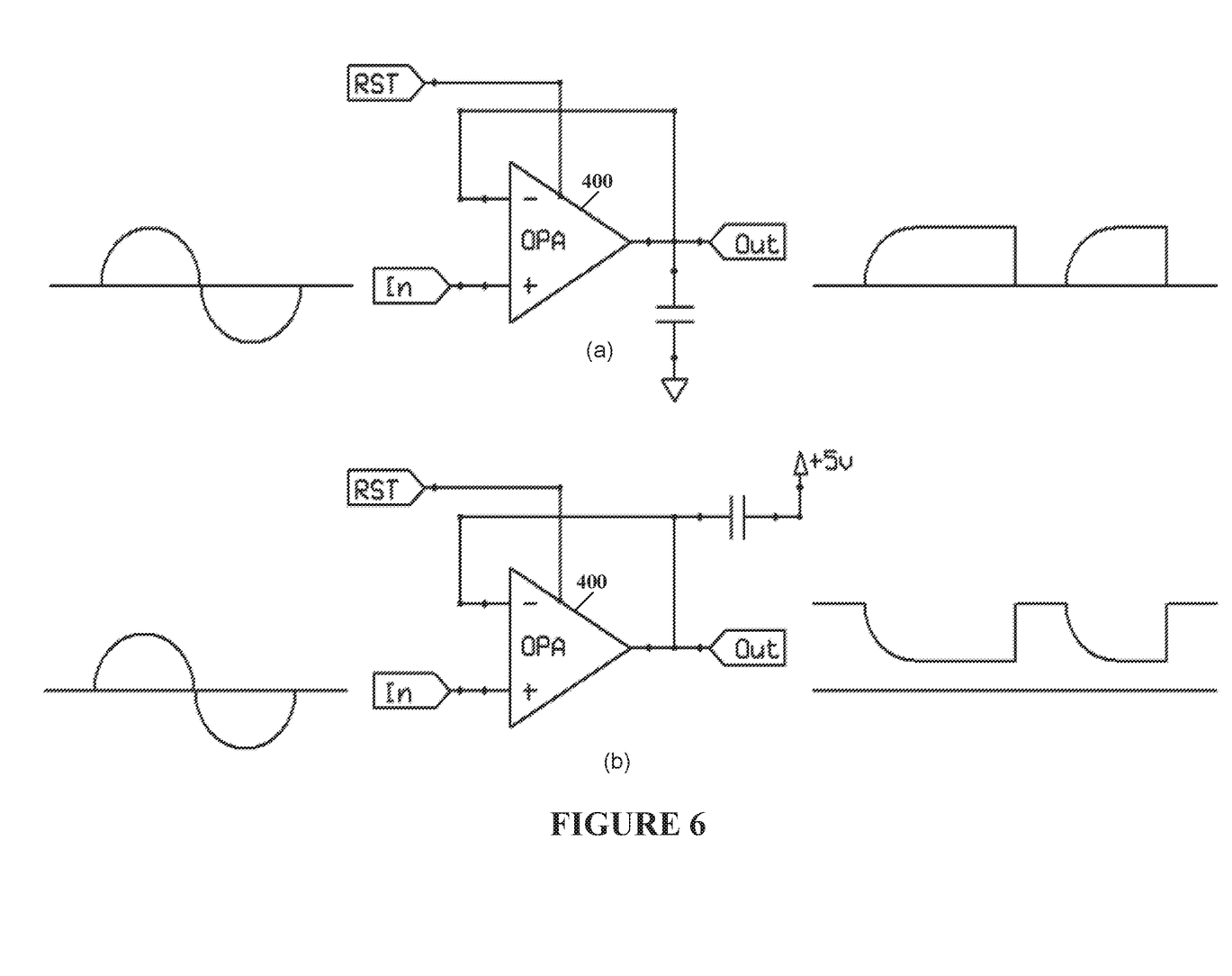
FIG. 6 illustrates schematic and waveform diagrams of maximum and minimum DC amplitude tracking and hold circuits with reset capabilities, according to specific example embodiments of this disclosure.

Referring to FIGS. 6(a) and 6(b), depicted are schematic and waveform diagrams of maximum and minimum DC amplitude tracking and hold circuits with reset capabilities, according to specific example embodiments of this disclosure. The circuits shown in FIGS. 6(a) and 6(b) utilize the operational amplifier 400 having controllable output modes, as more fully, described hereinabove. The operational amplifier circuit of FIG. 6(a) may be used as a maximum amplitude tracking and hold circuit by selecting (see FIG. 4) the b input of multiplexer 410 and the d input of multiplexer 412. This configuration effectively allows the output of transistor 406 (Vout) to follow the positive excursions of the input Vin and charge up the capacitor coupled between the output and common. Transistor 408 is kept off responsive to the selected d input. The voltage on the capacitor may be discharged by selecting the c input of multiplexer 410 and the f input of multiplexer 412.

The circuit of FIG. 6(h) may be used as a minimum amplitude tracking and hold circuit by selecting (see FIG. 4) the c input of multiplexer 410 and the e input of multiplexer 412. This configuration effectively allows the output of transistor 408 (Vout) to follow the negative excursions of the input Vin and charge the capacitor coupled between the output and +V. The voltage on the capacitor may be discharged by selecting the input of multiplexer 410 to pull Vout up to +V (5 volts) via transistor 406, and the d input of multiplexer 412 to set transistor 408 to off.

Figure 7:
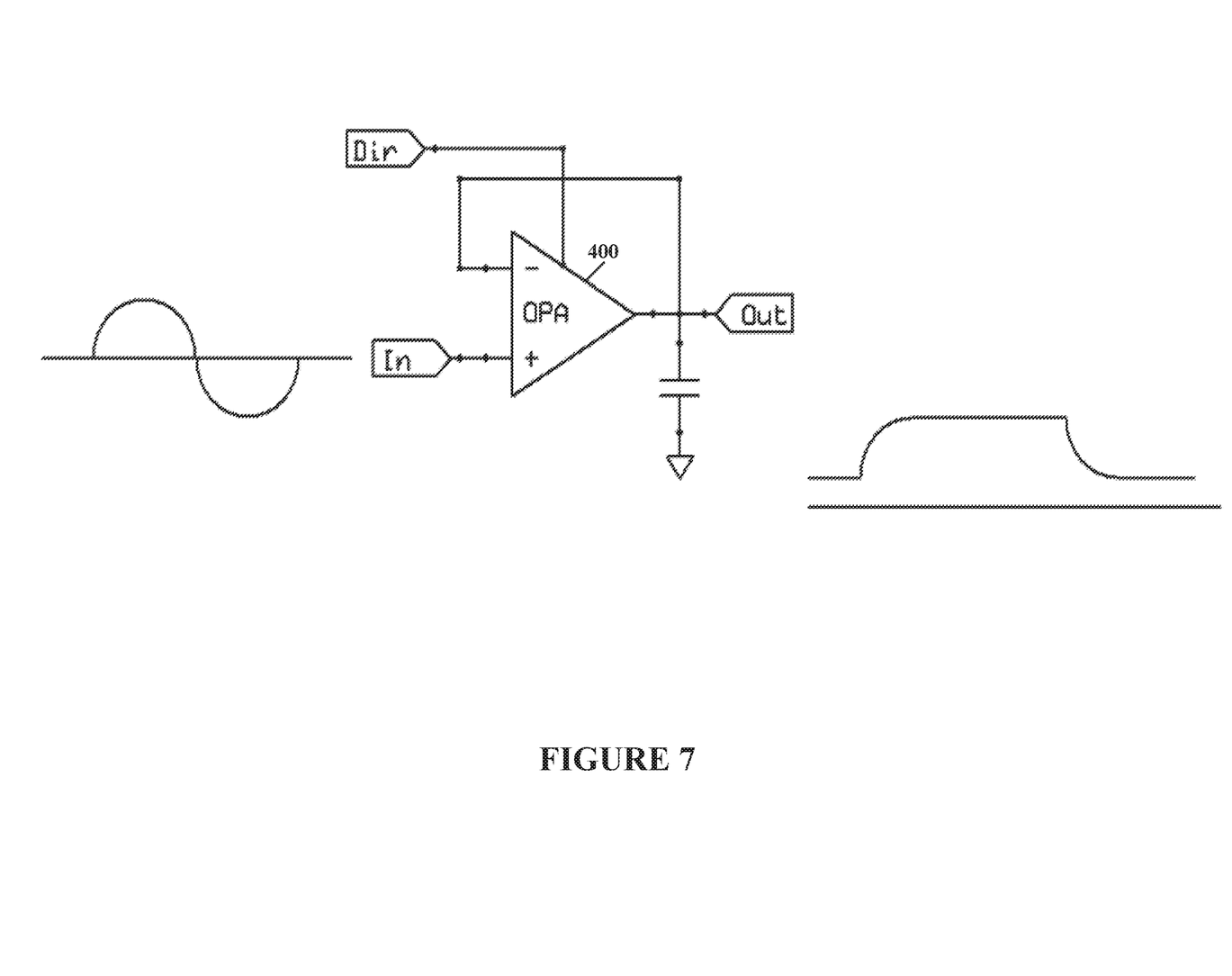
FIG. 7 illustrates schematic and waveform diagrams of a maximum and minimum DC amplitude tracking and hold circuit with direction control, according to specific example embodiments of this disclosure.

Referring to FIG. 7, depicted are schematic and waveform diagrams of a maximum and minimum DC amplitude tracking and hold circuit with direction control, according to specific example embodiments of this disclosure. The operational amplifier configuration shown in FIG. 8 may be used during a positive half cycle to charge up a capacitor coupled between the output and the common voltage potential, and the capacitor may be discharged during a negative half cycle. The capacitor may be charged during a positive input voltage half cycle by, selecting input b of the multiplexer 410 and input d of the multiplexer 412. The capacitor may be discharged during a negative half cycle by selecting input c of the multiplexer 410 and input e of the multiplexer 412. This control may be accomplished using a direction control signal (Dir) to change input selections of the multiplexers 410 and 412. The direction control signal at input Dir and may be controlled for example with a timer (not shown) configured for the period of the input waveform and/or a voltage comparator (not shown) measuring the input voltage.

Figure 8:
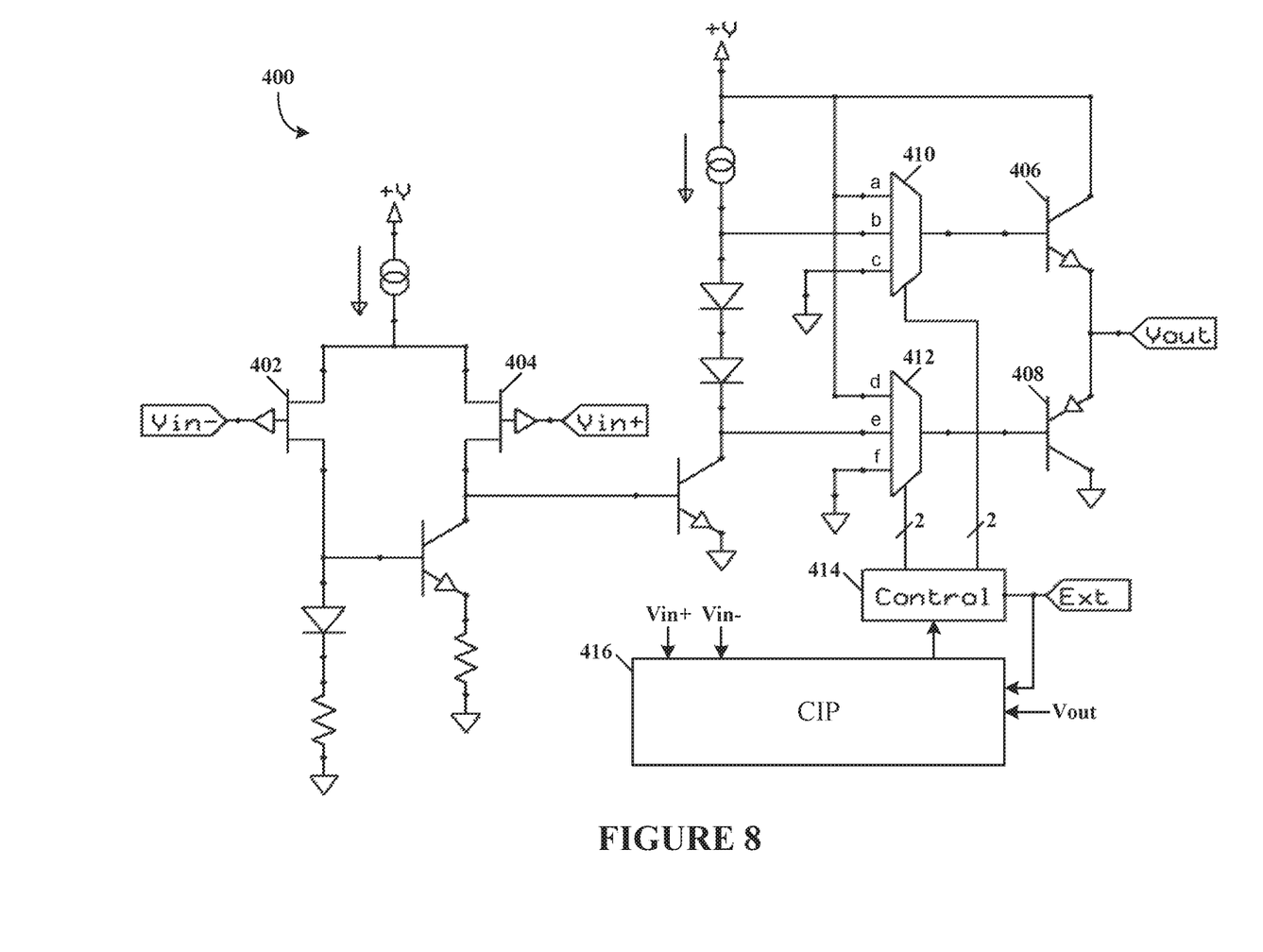
FIG. 8 illustrates a schematic diagram of the operational amplifier shown in FIG. 4 and a core independent peripheral, according to specific example embodiments of this disclosure.

FIG. 8 illustrates a schematic diagram of the operational amplifier 400 shown in FIG. 4 and a core independent peripheral, according to specific example embodiments of this disclosure. A core independent peripheral (CIP) 416 may be coupled to the operational amplifier 400 shown in FIG. 4. The CIP 416 may comprise at least one or more voltage comparator, a configurable logic cell (CLC), a voltage reference, an analog-to-digital converter (ADC), adder, subtractor, multiplier, divider, register, and the like. The CIP 416 may provide control signals to the control circuit 414 based upon voltage inputs Vin+ and/or Vin−, voltage output Vout, and/or external control signals from the external port (Ext).

The output of preferred embodiments of the operational amplifier 400 disclosed herein may be put into a high impedance tristate mode by selecting input c of multiplexer 410 and input d of multiplexer 412. The tristate mode may be used for output signal blanking. Reset to common voltage potential may be done by selecting input c of multiplexer 410 and input f of multiplexer 412. Reset to +V may be done by selecting input a of multiplexer 410 and input d of multiplexer 412. These various multiplexer input combinations may be selected by external control signals (Ext node) to the control circuit 414, which may also be provided from the CIP 416. It is contemplated and within the scope of this disclosure that the supply common potential may be a negative supply voltage or power supply common return.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. An operational amplifier having controllable output modes, comprising:
   a differential input circuit comprising an output and a differential input transistor pair receiving a differential input signal;
   a first multiplexer having a first input coupled to a supply voltage, a second input coupled to the output of the differential input circuit, a third input coupled to a supply common return and an output coupled to an input of a first output transistor;
   a second multiplexer having a first input coupled to the supply voltage, a second input coupled to the output of the differential input circuit, a third input coupled to the supply common return and an output coupled to an input of a second output transistor; and
   a control circuit coupled to the first and second multiplexers for selecting the inputs thereof, wherein the first and second multiplexers are independently controlled by the control circuit.

2. The operational amplifier according to claim 1, wherein the first and second output transistors are totem pole configured with an output therebetween, wherein the first output transistor is coupled to the supply voltage and the second output transistor is coupled to the supply common return.

3. The operational amplifier according to claim 1, wherein the first output transistor is on when the first input of the first multiplexer is selected.

4. The operational amplifier according to claim 1, wherein the first output transistor is controlled by the differential input signal when the second input of the first multiplexer is selected.

5. The operational amplifier according to claim 1, wherein the first output transistor is off when the third input of the first multiplexer is selected.

6. The operational amplifier according to claim 1, wherein the second output transistor is off when the first input of the second multiplexer is selected.

7. The operational amplifier according to claim 1, wherein the second output transistor is controlled by the differential input transistor pair when the second input of the second multiplexer is selected.

8. The operational amplifier according to claim 1, wherein the second output transistor is on when the third input of the second multiplexer is selected.

9. The operational amplifier according to claim 1, further comprising an external connection to the control circuit for externally controlling the selection of the inputs of the first and second multiplexers.

10. The operational amplifier according to claim 1, further comprising a core independent peripheral (CIP) coupled to the control circuit.

11. The operational amplifier according to claim 10, wherein the CIP has inputs coupled to inputs of the differential input transistor pair for measuring voltages thereon.

12. The operational amplifier according to claim 10, wherein the CIP has an input coupled to an output of the first and second output transistors for measuring an output voltage therefrom.

13. A circuit for at least partially tracking an input signal, comprising:
a differential input circuit comprising an output and a differential input transistor pair having inputs coupled to a differential signal;
a first multiplexer having a first input coupled to a supply voltage, a second input coupled to the output of the differential input circuit, a third input coupled to a supply common return and an output coupled to an input of a first output transistor;
a second multiplexer having a first input coupled to the supply voltage, a second input coupled to the output of the differential input circuit, a third input coupled to the supply common return and an output coupled to an input of a second output transistor;
the first and second output transistors are totem pole configured with an output therebetween, wherein the first output transistor is coupled to the supply voltage and the second output transistor is coupled to the supply common return; and
a control circuit coupled to the first and second multiplexers for selecting the inputs thereof, wherein the first and second multiplexers are independently controlled by the control circuit;
wherein selection of a certain combination of the first and second multiplexer inputs determines what part of the signal is tracked.

14. The circuit according to claim 13, wherein a positive input voltage amplitude tracking circuit is configured when the second input of the first multiplexer and the first input of the second multiplexer are selected and wherein an inverting input of the differential input circuit is coupled with the output of the first and second output transistors which is coupled via a resistor with ground.

15. The circuit according to claim 13, wherein a negative input voltage amplitude tracking circuit is configured when the third input of the first multiplexer and the second input of the second multiplexer are selected and wherein an inverting input of the differential input circuit is coupled with the output of the first and second output transistors which is coupled via a resistor with the supply voltage.

16. The circuit according to claim 13, wherein a positive input voltage tracking and hold circuit comprises:
a capacitor coupled between the output of the first and second output transistors and the supply common return and wherein an inverting input of the differential input circuit is coupled with the output of the first and second output transistors;
the second input of the first multiplexer is selected; and
the first input of the second multiplexer is selected;
whereby the capacitor is charged when a voltage input to the differential input transistor pair is positive.

17. The circuit according to claim 16, wherein the capacitor is discharged when the third input of the first multiplexer and the third input of the second multiplexer are selected.

18. The circuit according to claim 13, wherein a negative voltage tracking and hold circuit comprises:
a capacitor coupled between the output of the first and second output transistors and the supply voltage and wherein an inverting input of the differential input circuit is coupled with the output of the first and second output transistors;
the third input of the first multiplexer is selected; and
the second input of the second multiplexer is selected;
whereby the capacitor is charged when a voltage input to the differential input transistor pair is negative.

19. The circuit according to claim 18, wherein the capacitor is discharged when the first input of the first multiplexer and the first input of the second multiplexer are selected.

20. The circuit according to claim 13, wherein a maximum and minimum DC amplitude tracking and hold circuit comprises:
a capacitor is coupled between the output of the first and second output transistors and the supply common return and wherein an inverting input of the differential input circuit is coupled with the output of the first and second output transistors,
the capacitor is charged when the second input of the first multiplexer and the first input of the second multiplexer are selected and a voltage input to the differential input transistor pair is positive, and
the capacitor is discharged when the third input of the first multiplexer and the second input of the second multiplexer are selected and the voltage input to the differential input transistor pair is negative.

21. The circuit according to claim 20, wherein a control circuit is coupled to the first and second multiplexers and control the selection of the first and second multiplexer inputs.

22. A method for configuring operation of an operational amplifier output, said method comprising the steps of:
providing a differential input circuit comprising an output and a differential input transistor pair having inputs coupled to a differential signal;
providing a first multiplexer having a first input coupled to a supply voltage, a second input coupled to the output of the differential input circuit, a third input coupled to a supply common return and an output coupled to an input of a first output transistor;

providing a second multiplexer having a first input coupled to the supply voltage, a second input coupled to the output of the differential input circuit, a third input coupled to the supply common return and an output coupled to an input of a second output transistor; and selecting inputs of the first and second multiplexers independently from each other to configure operation of the first and second output transistors.

23. The method according to claim 22, further comprising the step of selecting the inputs of the first and second multiplexers with a core independent peripheral (CIP).

* * * * *